United States Patent
Sandhu

(10) Patent No.: US 8,564,039 B2
(45) Date of Patent: Oct. 22, 2013

(54) SEMICONDUCTOR DEVICES INCLUDING GATE STRUCTURES COMPRISING COLOSSAL MAGNETOCAPACITIVE MATERIALS

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 630 days.

(21) Appl. No.: 12/755,940

(22) Filed: Apr. 7, 2010

(65) Prior Publication Data

US 2011/0248778 A1    Oct. 13, 2011

(51) Int. Cl.
*H01L 29/78* (2006.01)
*H01L 29/82* (2006.01)

(52) U.S. Cl.
USPC ..... 257/300; 257/295; 257/296; 257/E29.255

(58) Field of Classification Search
USPC .......... 257/295, 296, 300, E29.344, E29.345, 257/E29.255
See application file for complete search history.

(56) References Cited

U.S. PATENT DOCUMENTS

| | | | |
|---|---|---|---|
| 5,297,077 A | 3/1994 | Imai et al. | |
| 5,335,138 A | 8/1994 | Sandhu et al. | |
| 6,214,687 B1 | 4/2001 | Sandhu et al. | |
| 6,395,602 B2 | 5/2002 | Sandhu et al. | |
| 6,492,241 B1 | 12/2002 | Rhodes et al. | |
| 6,653,154 B2 | 11/2003 | Doan et al. | |
| 6,657,270 B2 * | 12/2003 | Kim et al. | 257/423 |
| 6,661,088 B1 | 12/2003 | Yoda et al. | |
| 6,667,502 B1 | 12/2003 | Agarwal et al. | |
| 6,700,145 B1 | 3/2004 | Black et al. | |
| 6,746,912 B2 | 6/2004 | Nakata | |
| 6,762,450 B2 | 7/2004 | Sandhu et al. | |
| 6,869,877 B2 | 3/2005 | Rhodes et al. | |
| 6,900,496 B1 | 5/2005 | Sandhu et al. | |
| 7,005,697 B2 | 2/2006 | Batra et al. | |

(Continued)

OTHER PUBLICATIONS

Dufourcq et al., High Density Platinum Nanocrystals for Non-Volatile Memory Applications, Applied Physics Letters, 2008, vol. 92, pp. 073102-1-073102-3.

(Continued)

*Primary Examiner* — Anh Mai
(74) *Attorney, Agent, or Firm* — TraskBritt

(57) ABSTRACT

Semiconductor devices include a transistor having a gate structure located close to a channel region that comprises a colossal magnetocapacitive material. The gate structure is configured to affect electrical current flow through the channel region between a source and a drain. The colossal magnetocapacitive material optionally may be disposed between two structures, one or both of which may be electrically conductive, magnetic, or both electrically conductive and magnetic. Methods of fabricating semiconductor devices include forming a colossal magnetocapacitive material close to a channel region between a source and a drain of a transistor, and configuring the colossal magnetocapacitive material to exhibit colossal magnetocapacitance for generating an electrical field in the channel region. Methods of affecting current flow through a transistor include causing a colossal magnetocapacitive material to exhibit colossal magnetocapacitance and generate an electrical field in a channel region of a transistor.

21 Claims, 5 Drawing Sheets

(56) References Cited

U.S. PATENT DOCUMENTS

| | | | |
|---|---|---|---|
| 7,379,321 B2 * | 5/2008 | Ravelosona et al. | 365/145 |
| 7,452,759 B2 | 11/2008 | Sandhu | |
| 7,457,184 B2 | 11/2008 | Basceri et al. | |
| 7,488,665 B2 | 2/2009 | Agarwal et al. | |
| 2001/0009286 A1 | 7/2001 | Sandhu et al. | |
| 2001/0030339 A1 | 10/2001 | Sandhu et al. | |
| 2003/0003621 A1 | 1/2003 | Rhodes et al. | |
| 2003/0025142 A1 | 2/2003 | Rhodes et al. | |
| 2004/0056295 A1 | 3/2004 | Agarwal et al. | |
| 2005/0093052 A1 | 5/2005 | Agarwal et al. | |
| 2006/0081911 A1 | 4/2006 | Batra et al. | |
| 2006/0223251 A1 * | 10/2006 | Isogai | 438/197 |
| 2007/0122986 A1 | 5/2007 | Sandhu | |
| 2009/0085085 A1 | 4/2009 | Lai et al. | |
| 2009/0090946 A1 | 4/2009 | Lai et al. | |
| 2009/0141423 A1 | 6/2009 | Lai | |

OTHER PUBLICATIONS

Mamin et al, Giant Dielectric Susceptibility and Magnetocapacitance Effect in Manganites at Room Temperature, JETP Letters, 2007, vol. 86, No. 10, pp. 643-646.

Rairigh et al, Colossal Magnetocapacitance and Scale-Invariant Dielectric Response in Phase-Separated Manganites, Nature Physics, Aug. 2007, vol. 3, pp. 551-555.

Rumeau et al, Behavior Modeling of a CaCu3Ti4O12 Ceramic for Capacitor Applications, 2006 Annual Report Conference on Electrical Insulation and Dielectric Phenomena, pp. 23-26.

Hemberger et al., Multiferroicity and Colossal Magneto-Capacitance in Cr-Thiospinels, Aug. 4, 2006.

* cited by examiner

SEMICONDUCTOR DEVICES INCLUDING GATE STRUCTURES COMPRISING COLOSSAL MAGNETOCAPACITIVE MATERIALS

TECHNICAL FIELD

Embodiments of the present invention relate to semiconductor devices that include one or more transistors, and to methods of forming such semiconductor devices.

BACKGROUND

Semiconductor devices include one or more integrated circuits that can be used to store data, process electronic signals, etc. Such semiconductor devices are used in virtually all modern electronic devices. There are several different types of semiconductor devices used in modern electronics including, for example, memory devices, electronic signal processors, devices for capturing or acquiring images, etc. Each of these semiconductor devices typically comprises a plurality of transistors, which can be used as gates or switches for electrical signals.

One particular type of transistor is the field effect transistor. In a field effect transistor, electrical current is capable of flowing through the transistor between what is referred to as a "source" contact and a "drain" contact. The current flows across what is referred to as a "channel region" between the source and the drain. The electrical resistance between the source and the drain may be altered by subjecting the channel region to an electrical field. The source, drain, and channel region are often formed in a surface of a semiconductor material, such as a surface of a semiconductor substrate. To apply an electrical field to the channel region, a "gate" (which is essentially an electrical contact) is located adjacent (e.g., over) the channel region, and an electrical charge may be applied to the gate. For example, if each of the source, drain, and channel comprises a region in a substrate, an electrical charge may be applied to the gate by applying a voltage between the gate and the substrate. The magnitude of the electrical field present in the channel region and, hence, the electrical resistance between the source and the drain, is at least partially a function of the magnitude of the charge on the gate. A higher electrical resistance in the channel region may be used to represent a "1" in binary code, and a lower electrical resistance may be used to represent a "0" in binary code, or vice versa. By selectively applying a charge to the gate, the channel region between the source and the drain is caused to exhibit higher and lower values of electrical resistance, and the transistor is caused to be selectively characterized as exhibiting either a 1 or a 0 value.

A memory device, for example, may comprise an array of memory cells, each of which may comprise at least one transistor for storing a 1 or a 0 value in the memory cell. When electrical power to the memory device is interrupted, however, the data in any transistor in which an applied voltage was used to electrically charge the gate thereof may be lost as the voltage dissipates after power interruption. Such memory cells that do not retain data therein without continued power supply are referred to in the art as "volatile" memory cells.

To overcome the deficiencies of volatile memory cells, so-called "non-volatile memory (NVM) cells" have been developed that do not require continued supply of power to the memory cells in order to maintain data storage therein. For example, so-called "Flash memory" is memory that employs field effect transistors. In Flash memory, the gate of the transistor is split into two separate gate structures, one being a "floating gate" and the other being a "control gate." The floating gate is an electrically conductive, but electrically isolated (and, thus, a "floating") structure. In other words, the floating gate is entirely surrounded by non-conductive material. The floating gate is sized and located, however, such that electrical charge can be applied to the floating gate by applying sufficient charge to the control gate to cause charge carriers (e.g., electrons) to "tunnel" through the non-conductive material surrounding the floating gate to the floating gate. Once the charge is removed from the control gate, the charge remains on the floating gate, until sufficient charge of opposite polarity is again applied to the control gate to cause the charge carriers on the floating gate to tunnel out from the floating gate through the dielectric material surrounding the floating gate. The charge on the floating gate is used to provide an electrical field in the channel region between the source and the drain, and that magnitude of the charge (and the resulting electrical field) is used to alter the electrical resistance between the source and the drain to characterize the transistor as exhibiting either a 1 or a 0 value.

It has recently been discovered that certain types of materials are capable of exhibiting what has been referred to as the "colossal magnetocapacitance phenomenon" or "colossal magnetocapacitance" under certain conditions. See, for example, J. Hemberger et al., *Multiferroicity and Colossal Magneto-Capacitance in Cr-Thiospinels*, Phase Transitions, volume 79, issue 12, pp. 1065-1082 (December 2006); R. P. Rairigh et al., *Colossal Magnetocapacitance and Scale-Invariant Dielectric Response in Phase-Separated Manganites*, Nature Physics 3, pp. 551-555 (2007); and R. F. Mamin et al., *Giant Dielectric Susceptibility and Magnetocapacitance Effect in Manganites at Room Temperature*, JETP Letters, volume 86, number 10, pp. 643-646 (2007). In essence, certain materials are capable of exhibiting a relative permittivity of about 6,000 or more. For example, certain materials may be capable of exhibiting a relative permittivity of about 10,000 or more, or even 100,000 or more. As used herein, the term "colossal magnetocapacitive material" means and includes any material capable of exhibiting colossal magnetocapacitance. As used herein, the terms "colossal magnetocapacitance phenomenon" and "colossal magnetocapacitance" mean and include the ability of a material to exhibit a relative permittivity greater than about 6,000, the magnitude of the relative permittivity exhibited by the material being variable by varying the intensity of a magnetic field applied to the material.

DETAILED DESCRIPTION

The illustrations presented herein are not meant to be actual views of any particular semiconductor device, transistor, or system, but are merely idealized representations that are employed to describe the present invention. Additionally, elements common between figures may retain the same numerical designation.

In some embodiments, the present invention includes semiconductor devices having at least one transistor that employs the colossal magnetocapacitance phenomenon to affect the flow of current through the transistor. By way of example and not limitation, the colossal magnetocapacitance phenomenon may be used to selectively generate an electrical field within a channel region of a transistor to alter the flow of current through the channel region of the transistor between a source and a drain.

While each of the figures provided herewith is a cross-sectional view of a device or an intermediate product, in an effort to simplify and clarify the figures, only electrically conductive elements and materials have been cross-hatched. Electrically insulating and electrically semiconductive elements and materials are not cross-hatched in the figures.

Figure 1:
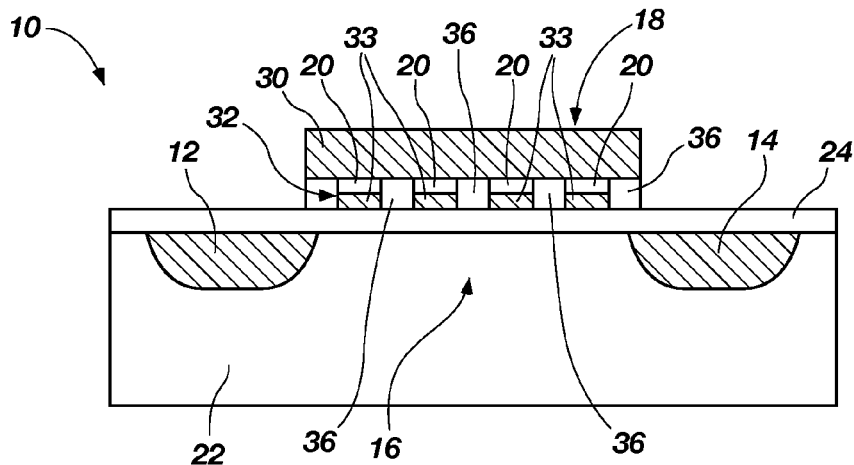
FIG. 1 is a partial cross-sectional view of an embodiment of a semiconductor device of the present invention that includes at least one transistor employing the colossal magnetocapacitance effect in controlling the flow of charge between a source and a drain of the transistor.

FIG. 1 is a partial cross-sectional view of a portion of a partially formed embodiment of a semiconductor device 10 of the present invention. FIG. 1 illustrates a single transistor, although the semiconductor device 10 may comprise a plurality of such transistors. The transistor shown in FIG. 1 includes a source 12, a drain 14, a channel region 16 between the source 12 and the drain 14, and a gate structure 18 that is located close to the channel region 16, but that may be electrically isolated therefrom by a gate dielectric material 24. As discussed in further detail hereinbelow, the gate structure 18 includes a colossal magnetocapacitive material 20, and may employ the colossal magnetocapacitance phenomenon to affect the flow of electrical current through the transistor between the source 12 and the drain 14.

The source 12, drain 14, and the channel region 16 between the source 12 and the drain 14 may comprise regions of a semiconductor material 22, such as, for example, regions of a substrate of semiconductor material 22. For example, the semiconductor material 22 may comprise a silicon substrate (e.g., a single crystal silicon wafer or chip), a germanium substrate, or a substrate of another semiconductor material. The source 12, the drain 14, and the channel region 16 of the transistor may be formed by, for example, selectively doping these regions of the semiconductor material 22 with ions to render the doped regions conductive or semiconductive.

As shown in FIG. 1, in some embodiments, a gate dielectric material 24 may be provided over the semiconductor material 22 and between the semiconductor material 22 and the gate structure 18. The gate dielectric material 24 may be electrically insulative, and may be used to electrically isolate the gate structure 18 from the source 12, the drain 14, and the channel region 16. The gate dielectric material 24 may be configured as a tunneling dielectric to enable "tunneling" of charge carriers (e.g., electrons) through the gate dielectric material 24 between the semiconductor material 22 and the gate structure 18 under certain conditions. In some embodiments, the gate dielectric material 24 has an average thickness, measured perpendicular to the underlying surface of the semiconductor material 22, of about seven nanometers (7 nm) or less. The gate dielectric material 24 may comprise, for example, an oxide (e.g., silicon dioxide), a nitride (e.g., silicon nitride), an oxynitride (which may be characterized as a mixture of silicon oxide and silicon nitride), or another electrically insulative material. The gate dielectric material 24 may also comprise what are referred to in the art as "high dielectric constant" (or "high K") materials. Furthermore, in some embodiments, the gate dielectric material 24 may comprise a single layer of dielectric material, or a stack of layers of different dielectric materials.

As previously mentioned, the gate structure 18 may include a colossal magnetocapacitive material 20 capable of exhibiting the colossal magnetocapacitance phenomenon. In some embodiments, the colossal magnetocapacitance phenomenon may be used to provide an electrical field in the channel region 16 of the transistor to affect the flow of current through the channel region 16 between the source 12 and the drain 14. With continued reference to FIG. 1, in some embodiments, the gate structure 18 may comprise a colossal magneto capacitor configured to provide an electrical field within the channel region 16. As used herein, the term "colossal magneto capacitor" means and includes any capacitor device or structure that includes a colossal magnetocapacitive material 20 and that is configured to generate a capacitance therein using the colossal magnetocapacitive material 20. As the colossal magneto capacitor may store charge therein for a period of time, even in the absence of applied power to the capacitor, the transistor may be non-volatile for that period of time, and a memory cell that includes the colossal magneto capacitor in the gate structure 18 and that employs the transistor for storing electronic data may be characterized as a non-volatile memory cell. As such, non-volatile memory devices may be fabricated that include a plurality of memory cells, each including a transistor as described herein, in accordance with some embodiments of the present invention.

The gate structure 18 of FIG. 1 comprises a colossal magneto capacitor that includes the colossal magnetocapacitive material 20, an electrically conductive and magnetic first plate structure 30, and an electrically conductive and magnetic second plate structure 32. The colossal magnetocapacitive material 20 is disposed between the first plate structure 30 and the second plate structure 32. The second plate structure 32 may be disposed proximate the semiconductor material 22, and the colossal magnetocapacitive material 20 may be disposed on a side of the second plate structure 32 opposite the colossal magnetocapacitive material 20. The first plate structure 30 may be disposed on a side of the colossal magnetocapacitive material 20 opposite the second plate structure 32.

By way of example, the colossal magnetocapacitive material 20 may comprise, for example, a rare earth manganite (i.e., $RMnO_3$, wherein R is a rare earth element), $CaCu_3Ti_4O_{12}$, $CdCr_2S_4$, $HgCr_2S_4$, or another material capable of exhibiting the colossal magnetocapacitance phenomenon. Such materials often exhibit multiple phases, and the phase separation is believed to contribute to the ability of these materials to exhibit the colossal magnetocapacitance phenomenon. As examples, rare earth manganites that may exhibit the colossal magnetocapacitance phenomenon include, for example, $La_{1-x}Sr_xMnO_3$ (e.g., x=0.1) and $(La_{1-y}Pr_y)_{1-x}Ca_xMnO_3$ (e.g., x=0.33 and y=0.5).

In some embodiments, the colossal magnetocapacitive material 20 may comprise one or more single crystals of colossal magnetocapacitive material 20. For example, the colossal magnetocapacitive material 20 may comprise a single crystal of colossal magnetocapacitive material 20 formed as a layer of the colossal magnetocapacitive material 20. In other words, a layer of the colossal magnetocapacitive material 20 may be formed to consist essentially of a single crystal of colossal magnetocapacitive material 20. In embodiments in which the gate structure 18 comprises a plurality of single crystals of colossal magnetocapacitive material 20, the single crystals may be laterally separated from one another within the gate structure 18.

In additional embodiments, the colossal magnetocapacitive material 20 may comprise one or more volumes of polycrystalline colossal magnetocapacitive material 20. In embodiments in which the gate structure 18 comprises a plurality of volumes of polycrystalline colossal magnetocapacitive material 20, the volumes may be laterally separated from one another within the gate structure 18.

In some embodiments, at least one of the first plate structure 30 and the second plate structure 32 may comprise an at least substantially continuous, single volume (e.g., a layer) of electrically conductive and magnetic material. For example, as shown in FIG. 1, the first plate structure 30 may comprise an at least substantially continuous layer of material. In some embodiments, at least one of the first plate structure 30 and the second plate structure 32 may comprise a discontinuous volume (e.g., a layer) of electrically conductive and magnetic material. For example, as shown in FIG. 1, the second plate structure 32 may comprise a discontinuous layer of material. For example, the second plate structure 32 may comprise a perforated layer of material, or the second plate structure 32 may comprise a plurality of laterally isolated volumes of material that together define the discontinuous volume of the second plate structure 32.

By forming the second plate structure 32 to be discontinuous, any shielding of an electric field originating from the colossal magnetocapacitive material 20 by the second plate structure 32 may be reduced. In other words, the intensity of an electrical field in the channel region 16 may be higher in embodiments in which the second plate structure 32 is discontinuous relative to similar embodiments that have a continuous second plate structure 32, but that are otherwise identical.

For example, as shown in FIG. 1, the second plate structure 32 may comprise a plurality of laterally isolated volumes 33 of electrically conductive and magnetic material, and a volume of colossal magnetocapacitive material 20 may be formed or otherwise provided over (e.g., directly on) each laterally isolated volume 33 of electrically conductive and magnetic material. In such embodiments, another dielectric material 36 may be provided between the laterally isolated volumes 33 of electrically conductive and magnetic material, as well as between the laterally isolated volumes of colossal magnetocapacitive material 20 formed or otherwise provided over each laterally isolated volume 33 of material, as shown in FIG. 1. The dielectric material 36 may comprise an electrically insulative material such as, for example, an oxide (e.g., silicon dioxide), a nitride (e.g., silicon nitride), an oxynitride (which may be characterized as a mixture of silicon oxide and silicon nitride), or another electrically insulative material. The dielectric material 36 may also comprise a high dielectric constant material.

As previously mentioned, the first plate structure 30 and the second plate structure 32 may comprise an electrically conductive and magnetic material. By way of example and not limitation, the first plate structure 30 and the second plate structure 32 may comprise a material such as, for example, a cobalt, nickel, and iron (CoNiFe) based alloy, a cobalt and iron (CoFe) based alloy, a cobalt and nickel (CoNi) based alloy, or an iron and nickel (FeNi) based alloy. The first plate structure 30 and the second plate structure 32 may comprise the same or different electrically conductive and magnetic materials.

In some embodiments, the first plate structure 30 and the second plate structure 32 may be comprised of magnetic materials so as to provide a magnetic field in a region comprising the colossal magnetocapacitive material 20 having a selected orientation, a selected magnitude, or both a selected orientation and a selected magnitude. The orientation and magnitude of the magnetic field provided by the magnetized first plate structure 30 and second plate structure 32 may be selected to enhance a relative permittivity exhibited by the colossal magnetocapacitive material 20 and the intensity of an electrical field within the channel region 16 generated by a colossal magnetocapacitance provided by the colossal magnetocapacitive material 20. For example, in some embodiments, the first plate structure 30 and the second plate structure 32 may be magnetized so as to provide a magnetic field within the colossal magnetocapacitive material 20 that is oriented generally perpendicular to the surface of the underlying semiconductor material 22 (i.e., in the vertical direction from the perspective of FIG. 1). In other embodiments, the first plate structure 30 and the second plate structure 32 may be magnetized so as to provide a magnetic field within the colossal magnetocapacitive material 20 that is oriented generally parallel to the surface of the underlying semiconductor material 22 (i.e., in the horizontal direction from the perspective of FIG. 1).

Furthermore, an external (to the transistor) magnetic field generating device may be used in addition to, or as an alternative to the magnetic plate structures 30, 32 to provide a magnetic field in the region comprising the colossal magnetocapacitive material 20. By way of example and not limitation, a hard magnetic device, or an electromagnetic device may be used to provide a magnetic field in the colossal magnetocapacitive material 20 to enable the colossal magnetocapacitive material 20 to exhibit colossal magnetocapacitance, or to enhance the ability of the colossal magnetocapacitive material 20 to exhibit colossal magnetocapacitance.

In some embodiments, each of the colossal magnetocapacitive material 20, the first plate structure 30, and the second plate structure 32 may have an average thickness, measured perpendicular to the underlying surface of the semiconductor material 22, of about ten nanometers (10 nm or less). As a non-limiting example, each of the colossal magnetocapacitive material 20, the first plate structure 30, and the second plate structure 32 may have an average thickness, measured perpendicular to the underlying surface of the semiconductor material 22, of between about one nanometer (1 nm) and about five nanometers (5 nm). In some embodiments, each of the colossal magnetocapacitive material 20, the first plate structure 30, and the second plate structure 32 may have similar or identical average thicknesses, or they may have differing average thicknesses. For example, the first plate structure 30 may be thicker than the colossal magnetocapacitive material 20 and the second plate structure 32, as shown in FIG. 1.

During operation, a capacitance may be generated in the colossal magneto capacitor of the gate structure 18 of the transistor of the semiconductor device 10, using the colossal magnetocapacitive material 20, by providing a voltage across the colossal magnetocapacitive material 20. For example, a voltage may be provided between the first plate structure 30 and the second plate structure 32, or between the first plate structure 30 and the semiconductor material 22, to generate a capacitance in the colossal magneto capacitor of the gate structure 18 of the transistor of the semiconductor device 10. The capacitance generated in the colossal magneto capacitor may result in the generation of an electrical field that may extend into the channel region 16 between the source 12 and the drain 14 of the transistor of the semiconductor device 10.

Figure 2:
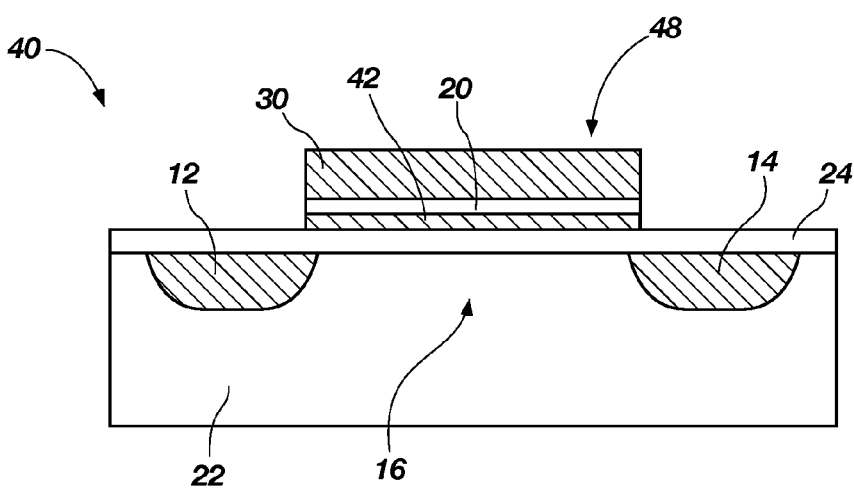
FIG. 2 is a partial cross-sectional view of another embodiment of a semiconductor device that includes at least one transistor employing the colossal magnetocapacitance effect in controlling the flow of charge between a source and a drain of the transistor.

FIG. 2 is a partial cross-sectional view of a portion of a partially formed embodiment of another semiconductor device 40 of the present invention that includes at least one transistor. The transistor of the semiconductor device 40 of FIG. 2 is similar to the transistor of the semiconductor device 10 shown in FIG. 1, and includes a source 12, a drain 14, and a channel region 16 between the source 12 and the drain 14, as previously described in relation to FIG. 1. The semiconductor device 40 of FIG. 2 also may comprise a gate dielectric material 24 as previously described with reference to FIG. 1. The transistor of the semiconductor device 40 also includes a gate structure 48 that is located close to the channel region 16, but that may be separated therefrom by the gate dielectric material 24. The gate structure 48 is generally similar to the gate structure 18 previously described with reference to FIG. 1, and comprises a colossal magneto capacitor that includes a first plate structure 30, a second plate structure 42, and a colossal magnetocapacitive material 20 disposed between the first plate structure 30 and the second plate structure 42. The second plate structure 42 of the gate structure 48 comprises a single, continuous volume of electrically conductive and magnetic material, in contrast to the plurality of laterally isolated volumes 33 of electrically conductive and magnetic material previously described in relation to FIG. 1. Furthermore, in the embodiment of FIG. 2, a single, continuous volume of colossal magnetocapacitive material 20 is disposed over the single, continuous volume of electrically conductive and magnetic material of the second plate structure 42. The single, continuous volume of colossal magnetocapacitive material 20 may comprise a single crystal of the colossal magnetocapacitive material 20, or the single, continuous volume of colossal magnetocapacitive material 20 may comprise a volume of polycrystalline colossal magnetocapacitive material 20. The gate structure 48 of the semiconductor device 40 may employ the colossal magnetocapacitance phenomenon to provide a capacitance and generate an electrical field to affect the flow of electrical current through the transistor between the source 12 and the drain 14, as previously described in relation to FIG. 1.

Figure 3:
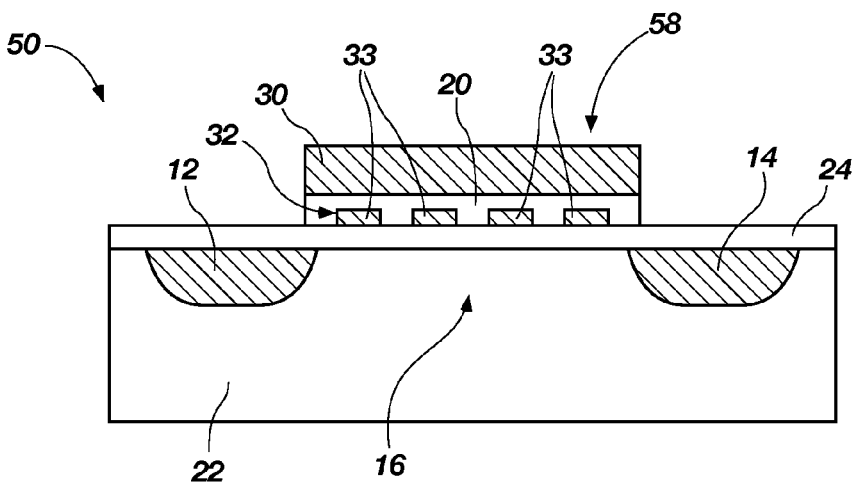
FIG. 3 is a partial cross-sectional view of another embodiment of a semiconductor device that includes at least one transistor employing the colossal magnetocapacitance effect in controlling the flow of charge between a source and a drain of the transistor.

FIG. 3 is a partial cross-sectional view of a portion of a partially formed embodiment of another semiconductor device 50 of the present invention that includes at least one transistor. The transistor of the semiconductor device 50 of FIG. 3 is similar to the transistor of the semiconductor device 10 shown in FIG. 1, and includes a source 12, a drain 14, and a channel region 16 between the source 12 and the drain 14, as previously described in relation to FIG. 1. The semiconductor device 50 of FIG. 3 also may comprise a gate dielectric material 24 as previously described with reference to FIG. 1. The transistor of the semiconductor device 50 also includes a gate structure 58 that is located close to the channel region 16, but that may be separated therefrom by the gate dielectric material 24. The gate structure 58 is generally similar to the gate structure 18 previously described with reference to FIG. 1, and comprises a colossal magneto capacitor that includes a first plate structure 30, a second plate structure 32, and a colossal magnetocapacitive material 20 disposed between the first plate structure 30 and the second plate structure 32. The second plate structure 32 of the gate structure 58 comprises a plurality of laterally isolated volumes 33 of electrically conductive and magnetic material, as previously described in relation to FIG. 1. In the embodiment of FIG. 3, however, a single, continuous volume of colossal magnetocapacitive material 20 is disposed over the laterally isolated volumes 33 of electrically conductive and magnetic material. The single, continuous volume of colossal magnetocapacitive material 20 may comprise a single crystal of the colossal magnetocapacitive material 20, or the single, continuous volume of colossal magnetocapacitive material 20 may comprise a volume of polycrystalline colossal magnetocapacitive material 20. The gate structure 58 of the semiconductor device 50 may employ the colossal magnetocapacitance phenomenon to provide a capacitance and generate an electrical field to affect the flow of electrical current through the transistor between the source 12 and the drain 14, as previously described in relation to FIG. 1.

Figure 4:
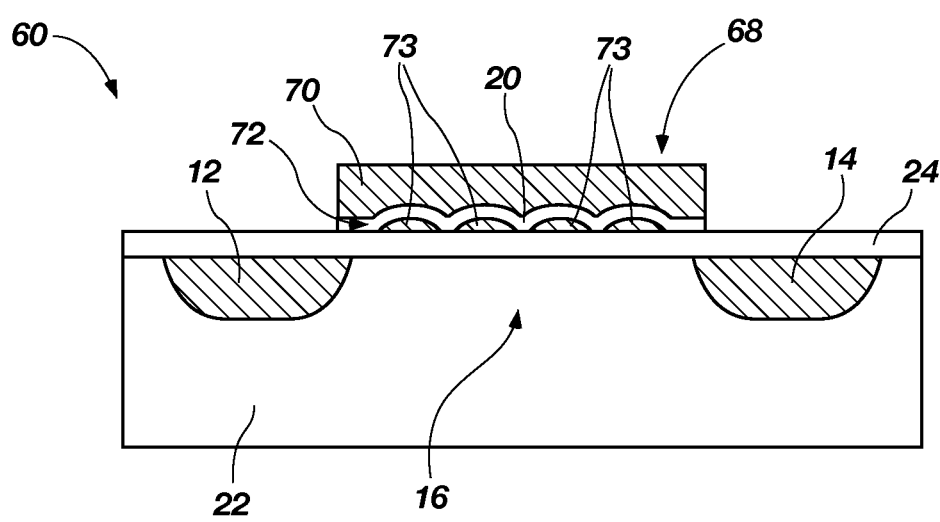
FIG. 4 is a partial cross-sectional view of another embodiment of a semiconductor device that includes at least one transistor employing the colossal magnetocapacitance effect in controlling the flow of charge between a source and a drain of the transistor.

FIG. 4 is a partial cross-sectional view of a portion of a partially formed embodiment of yet another semiconductor device 60 of the present invention that includes at least one transistor. The transistor of the semiconductor device 60 of FIG. 4 is similar to the transistor of the semiconductor device 10 shown in FIG. 1 and the transistor of the semiconductor device 50 shown in FIG. 3, and includes a source 12, a drain 14, and a channel region 16 between the source 12 and the drain 14, as previously described in relation to FIG. 1. The semiconductor device 60 of FIG. 4 also may comprise a gate dielectric material 24 as previously described with reference to FIG. 1. The transistor of the semiconductor device 60 also includes a gate structure 68 that is located close to the channel region 16, but that may be separated therefrom by the gate dielectric material 24. The gate structure 68 is generally similar to the gate structure 18 previously described with reference to FIG. 1, and comprises a colossal magneto capacitor that includes a first plate structure 70, a second plate structure 72, and a colossal magnetocapacitive material 20 disposed between the first plate structure 70 and the second plate structure 72. The second plate structure 72 of the gate structure 68 comprises a plurality of laterally isolated volumes 73 of electrically conductive and magnetic material. In the embodiment of FIG. 4, however, the laterally isolated volumes 73 of electrically conductive and magnetic material may comprise self-assembled volumes of material, as described in further detail below. Each of the laterally isolated volumes 73 of electrically conductive and magnetic material may have a semi-spherical shape, as shown in FIG. 4. A single, continuous volume of colossal magnetocapacitive material 20 is disposed over the laterally isolated volumes 73 of electrically conductive and magnetic material. The single, continuous volume of colossal magnetocapacitive material 20 may comprise a single crystal of the colossal magnetocapacitive material 20, or the single, continuous volume of colossal magnetocapacitive material 20 may comprise a volume of polycrystalline colossal magnetocapacitive material 20. The gate structure 68 of the semiconductor device 60 may employ the colossal magnetocapacitance phenomenon to provide a capacitance and generate an electrical field to affect the flow of electrical current through the transistor between the source 12 and the drain 14, as previously described in relation to FIG. 1.

Additional embodiments of the present invention include methods of forming semiconductor devices like those shown in FIGS. 1 through 3. In accordance with such methods, a colossal magnetocapacitive material may be formed proximate a channel region 16 between a source 12 and a drain 14 of a transistor, and configuring the colossal magnetocapacitive material 20 to exhibit colossal magnetocapacitance for generating an electrical field in the channel region 16.

One embodiment of a method of the present invention that may be used to form the semiconductor device 10 of FIG. 1 is described below with reference to FIGS. 5A through 5C.

Figure 5A:
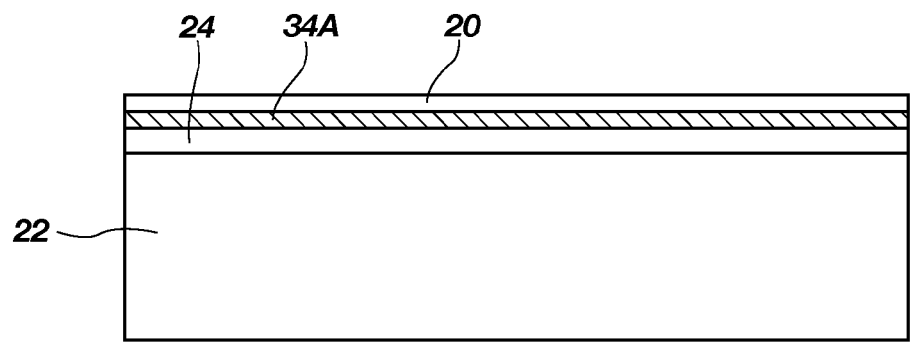
FIGS. 5A through 5C are partial cross-sectional views of intermediate products formed during embodiments of methods described herein that may be used to form a semiconductor device like that shown in FIG. 1.

Referring to FIG. 5A, an optional gate dielectric material 24 may be provided over at least a region of a semiconductor material 22 comprising what will ultimately be defined as a channel region 16 of a transistor by subsequent processing. As this stage of manufacturing, the source 12 and drain 14 may not be formed or otherwise defined by, for example, selectively doping regions of the semiconductor material 22 to introduce charge carriers into the regions of the semiconductor material 22.

As previously mentioned, the gate dielectric material 24 may be formed to comprise an electrically insulative material such as those previously mentioned herein, and may be used to electrically isolate the gate structure 18 from the source 12, the drain 14, and the channel region 16 as previously described. The gate dielectric material 24 may be formed to have a chemical composition and an average thickness that will enable selective tunneling of charge carriers (e.g., electrons) through the gate dielectric material 24 under certain conditions. Furthermore, in some embodiments, the gate dielectric material 24 may be formed to comprise an at least substantially continuous single dielectric material, or an at least substantially continuous stack of different dielectric materials.

The gate dielectric material 24 may be formed over (e.g., directly on) a surface of the semiconductor material 22 using one or more processes such as, for example, chemical vapor deposition (CVD), atomic layer deposition (ALD), or any other process known in the art for the particular material to be used as the gate dielectric material 24.

With continued reference to FIG. 5A, an electrically conductive and magnetic material 34A may be formed (e.g., deposited, grown, or otherwise provided) over (e.g., directly on) the gate dielectric material 24. The electrically conductive and magnetic material 34A is used to form the first plate structure 30 (FIG. 1) and may be selected from any of the materials previously mentioned in relation to the first plate structure 30 including, for example, cobalt, nickel, and iron (CoNiFe) based alloys, cobalt and iron (CoFe) based alloys, cobalt and nickel (CoNi) based alloys, and iron and nickel (FeNi) based alloys.

The electrically conductive and magnetic material 34A may be formed over the gate dielectric material 24 using one or more processes such as, for example, physical vapor deposition (PVD), chemical vapor deposition (CVD), atomic layer deposition (ALD), electroless chemical plating, electrolytic plating, or any other process known in the art for the particular material to be used as the electrically conductive and magnetic material 34A.

After providing the electrically conductive and magnetic material 34A over the gate dielectric material 24, colossal magnetocapacitive material 20 may be formed (e.g., deposited, grown, or otherwise provided) over (e.g., directly on) the electrically conductive and magnetic material 34A. The colossal magnetocapacitive material 20 may be selected from any of those materials previously discussed herein including, for example, one or more of a rare earth manganite, $CaCu_3Ti_4O_{12}$, $CdCr_2S_4$, and $HgCr_2S_4$. In some embodiments, the colossal magnetocapacitive material may be formed to comprise an at least substantially continuous layer of the colossal magnetocapacitive material 20.

The colossal magnetocapacitive material 20 may be formed over the electrically conductive and magnetic material 34A using one or more processes such as, for example, pulsed laser deposition (PLD), chemical vapor deposition (CVD) or atomic layer deposition (ALD) or any other process known in the art for the particular material to be used as the colossal magnetocapacitive material 20. For example, $(La_{99.5}Pr_{0.5})_{0.67}Ca_{0.33}MnO_3$ has been grown using pulsed laser deposition at a rate of 0.05 nm per second on an $NdGaO_3$ (NGO), (110) oriented substrate at 820° C. in an oxygen atmosphere of 420 mTorr. See, e.g., R. P. Rairigh et al., *Colossal Magnetocapacitance and Scale-Invariant Dielectric Response in Phase-Separated Manganites*, Nature Physics 3, pp. 551-555 (2007). In some embodiments, the colossal magnetocapacitive material 20 may be formed on a separate material (e.g., a substrate) and subsequently transferred to the electrically conductive and magnetic material 34A.

Figure 5B:
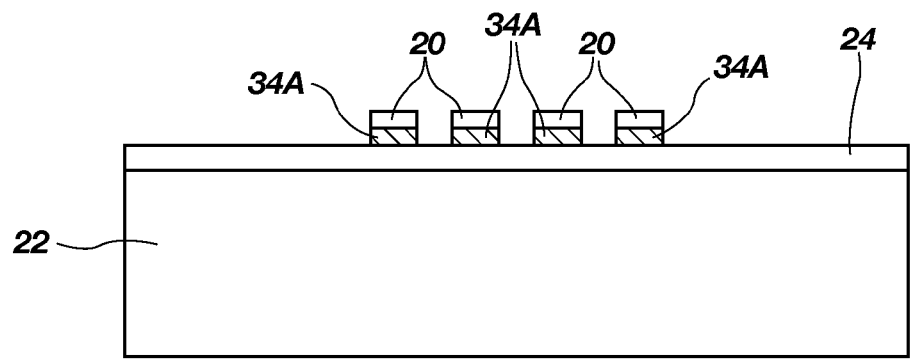

Referring to FIG. 5B, the colossal magnetocapacitive material 20 and the underlying electrically conductive and magnetic material 34A may be patterned. For example, a masking and etching process may be used to pattern the colossal magnetocapacitive material 20 and the underlying electrically conductive and magnetic material 34A. A mask material (not shown) (e.g., a photoresist material or a hard mask material) may be provided over the colossal magnetocapacitive material 20. Openings may be provided in the mask material, and one or more etchants may be used to etch the colossal magnetocapacitive material 20 and the electrically conductive and magnetic material 34A through the openings in the mask material. Masking and etching processes are generally known in the art. After etching the colossal magnetocapacitive material 20 and the electrically conductive and magnetic material 34A, the mask material may be removed from the workpiece.

Figure 5C:
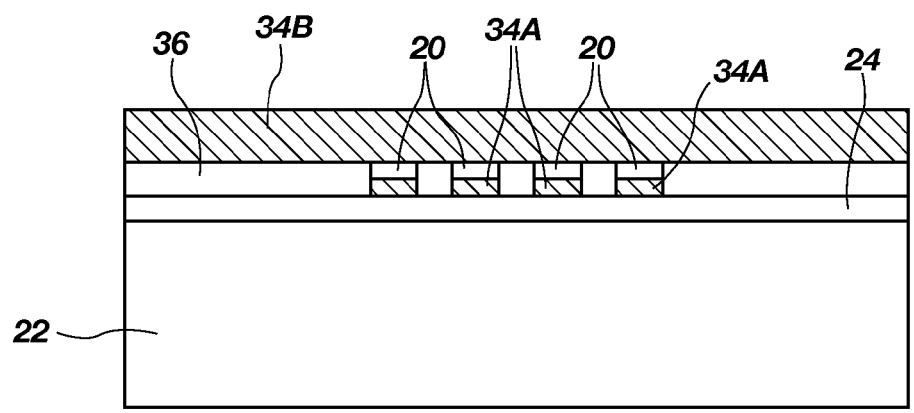

Referring to FIG. 5C, another dielectric material 36 may be provided over the gate dielectric material 24 and the remaining portions of the electrically conductive and magnetic material 34A and the colossal magnetocapacitive material 20. The dielectric material 36 may comprise an electrically insulative material, as previously discussed, and may be deposited using one or more processes such as, for example, chemical vapor deposition (CVD), atomic layer deposition (ALD), or any other process known in the art for the particular material to be used as the dielectric material 36.

If necessary or desirable, the dielectric material 36 may be subjected to an etching process, a polishing process, or a chemical-mechanical polishing process (CMP) to expose the remaining portions of the colossal magnetocapacitive material 20 through the major surface of the dielectric material 36.

With continued reference to FIG. 5C, another electrically conductive and magnetic material 34B may be formed (e.g., deposited, grown, or otherwise provided) over (e.g., directly on) the dielectric material 36, and the surfaces of the remaining portions of the colossal magnetocapacitive material 20 exposed therethrough. The electrically conductive and magnetic material 34B is used to form the second plate structure 32 (FIG. 1) and may be selected from any of the materials previously discussed herein in relation to the second plate structure 32 including, for example, cobalt, nickel, and iron (CoNiFe) based alloys, cobalt and iron (CoFe) based alloys, cobalt and nickel (CoNi) based alloys, and iron and nickel (FeNi) based alloys. In some embodiments, the electrically conductive and magnetic material 34B may be formed to comprise an at least substantially continuous layer of the electrically conductive and magnetic material 34B.

The electrically conductive and magnetic material 35B may be formed using any of the processes previously mentioned herein in relation to the first electrically conductive and magnetic material 34A.

After providing the structure illustrated in FIG. 5C, another patterning process may be used to pattern the electrically conductive and magnetic material 35B and the dielectric material 36 in such a manner as to form the gate structure 18 and the semiconductor device 10, as shown in FIG. 1. Additional processing may be performed on the semiconductor device 10 shown in FIG. 1 as necessary or desirable in order to provide a fully manufactured semiconductor device suitable for end use.

Furthermore, as previously discussed, the electrically conductive and magnetic materials 34A and 35B may comprise hard magnetic materials, and may be magnetized during fabrication of the semiconductor device 10 (FIG. 1) such that they provide a magnetic field in a region comprising the colossal magnetocapacitive material 20 having a selected orientation, a selected magnitude, or both a selected orientation and a selected magnitude.

Another embodiment of a method of the present invention that may be used to form the semiconductor device 50 of FIG. 3 is described below with reference to FIGS. 6A through 6C.

Figure 6A:
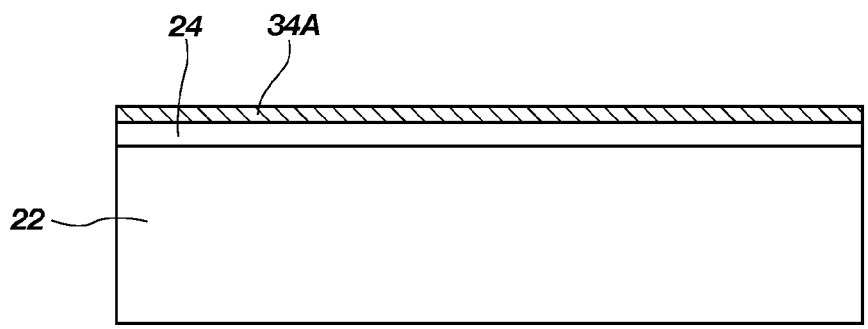
FIGS. 6A through 6C are partial cross-sectional views of intermediate products formed during embodiments of methods described herein that may be used to faun a semiconductor device like that shown in FIG. 3.

Referring to FIG. 6A, an optional gate dielectric material 24 may be provided over at least a region of a semiconductor material 22 comprising what will ultimately be defined as a channel region 16 of a transistor, and an electrically conductive and magnetic material 34A may be formed (e.g., deposited, grown, or otherwise provided) over (e.g., directly on) the gate dielectric material 24, as previously discussed in relation to FIG. 5A. In this embodiment, however, a patterning process is used to pattern the electrically conductive and magnetic material 34A prior to forming a colossal magnetocapacitive material 20 over the electrically conductive and magnetic material 34A.

Figure 6B:
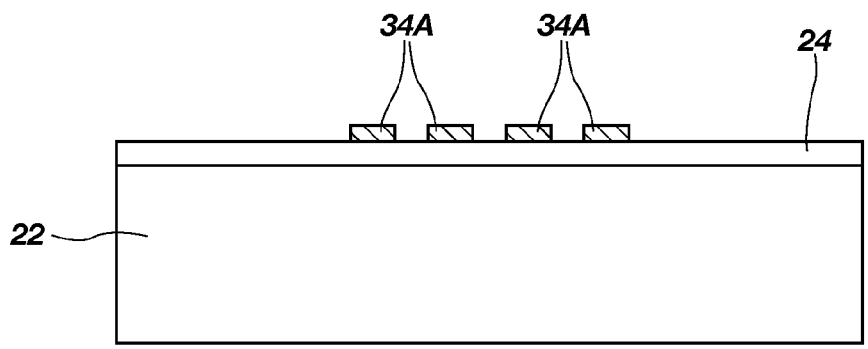

Referring to FIG. 6B, the electrically conductive and magnetic material 34A may be patterned using, for example, a masking and etching process. A mask material (not shown) (e.g., a photoresist material or a hard mask material) may be provided over the electrically conductive and magnetic material 34A. Openings may be provided in the mask material, and one or more etchants may be used to etch the electrically conductive and magnetic material 34A through the openings in the mask material. After etching the electrically conductive and magnetic material 34A, the mask material may be removed from the workpiece.

Figure 6C:
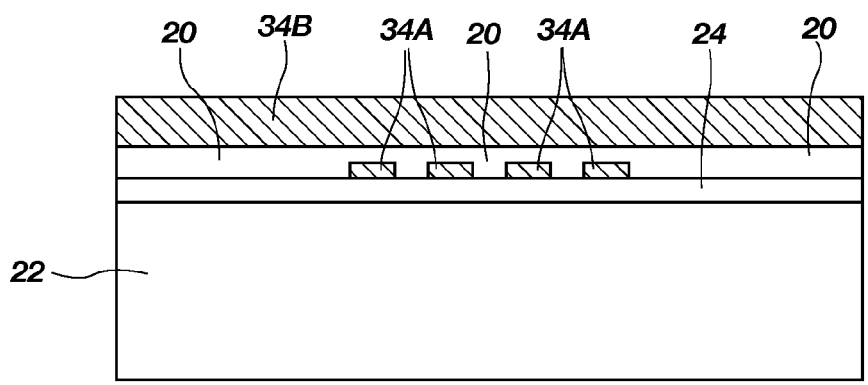

Referring to FIG. 6C, a colossal magnetocapacitive material 20 may be formed over the gate dielectric material 24 and the remaining portion or portions of the electrically conductive and magnetic material 34A. The colossal magnetocapacitive material 20 may be formed using materials and processes as previously described in relation to FIG. 5A, and may be formed to have an average thickness greater than an average thickness of the remaining portion or portions of the electrically conductive and magnetic material 34A, such that the remaining portion or portions of the electrically conductive and magnetic material 34A is buried within the colossal magnetocapacitive material 20, as shown in FIG. 6C.

After forming the colossal magnetocapacitive material 20, another electrically conductive and magnetic material 34B may be formed over the colossal magnetocapacitive material 20 using materials and processes as previously described in relation to FIG. 5C to form the structure shown in FIG. 6C.

After providing the structure illustrated in FIG. 6C, another patterning process may be used to pattern the electrically conductive and magnetic material 34B and the colossal magnetocapacitive material 20 in such a manner as to form the gate structure 58 and the semiconductor device 50, as shown in FIG. 3. Optionally, the electrically conductive and magnetic materials 34A, 34B may be magnetized, as previously discussed. Furthermore, additional processing may be performed on the semiconductor device 50 shown in FIG. 3 as necessary or desirable in order to provide a fully manufactured semiconductor device suitable for end use.

Yet another embodiment of a method of the present invention that may be used to form the semiconductor device 60 of FIG. 4 is described below with reference to FIGS. 7A through 7C.

Figure 7A:
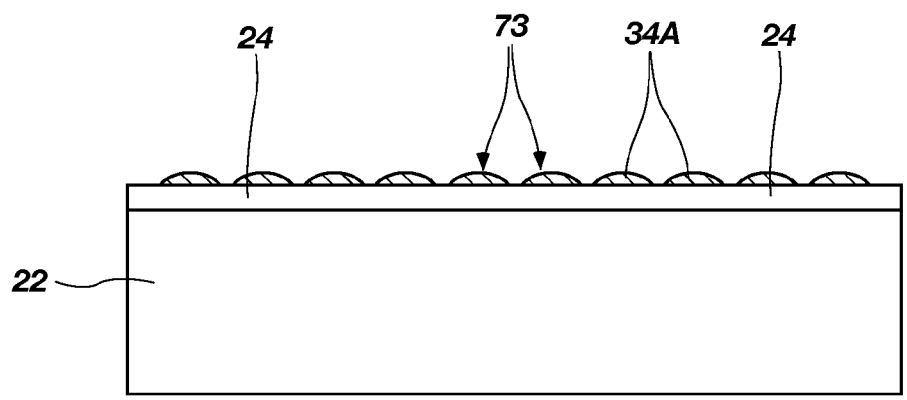
FIGS. 7A through 7C are partial cross-sectional views of intermediate products formed during embodiments of methods described herein that may be used to form a semiconductor device like that shown in FIG. 4.

Referring to FIG. 7A, an optional gate dielectric material 24 may be provided over at least a region of a semiconductor material 22 comprising what will ultimately be defined as a channel region 16 (FIG. 1) of a transistor.

An electrically conductive and magnetic material 34A may be formed (e.g., deposited, grown, or otherwise provided) over (e.g., directly on) the gate dielectric material 24. In this embodiment, however, the electrically conductive and magnetic material 34A is formed in such a manner as to result in self-assembly of laterally isolated volumes 73 of the electrically conductive and magnetic material 34A. By way of example and not limitation, the laterally isolated volumes 73 of the electrically conductive and magnetic material 34A may be self-assembled by depositing (by, for example, PVD or CVD) a relatively small quantity of the electrically conductive and magnetic material 34A, and, optionally, annealing the deposited quantity of the electrically conductive and magnetic material 34A. The surface tension of the electrically conductive and magnetic material 34A may cause the electrically conductive and magnetic material 34A to collect into a plurality of self-assembled, laterally isolated volumes 73 of the electrically conductive and magnetic material 34A. In additional embodiments, the relatively small quantity of the electrically conductive and magnetic material 34A may be deposited at a temperature that will cause the electrically conductive and magnetic material 34A to collect into the plurality of self-assembled, laterally isolated volumes 73 without requiring any subsequent annealing process after deposition.

Figure 7B:
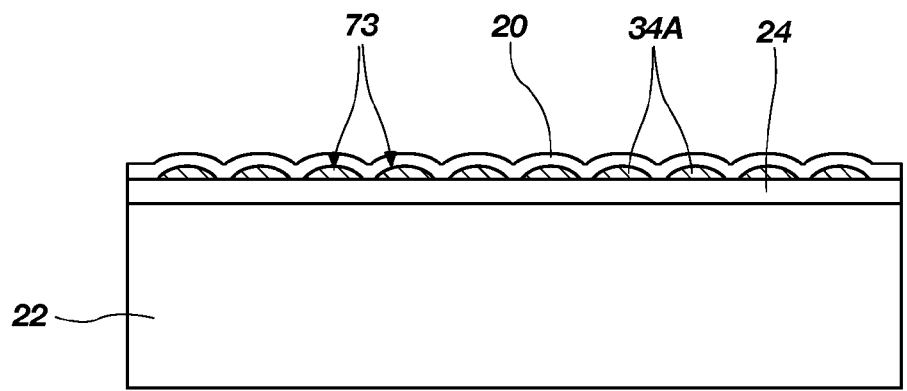

Referring to FIG. 7B, a colossal magnetocapacitive material 20 may be formed over the self-assembled, laterally isolated volumes 73 of the electrically conductive and magnetic material 34A. The colossal magnetocapacitive material 20 may be formed using materials and processes as previously described in relation to FIG. 5A. After forming the colossal magnetocapacitive material 20, another electrically conductive and magnetic material 34B may be formed over the colossal magnetocapacitive material 20 using materials and processes as previously described in relation to FIG. 5C to form the structure shown in FIG. 7C.

Figure 7C:
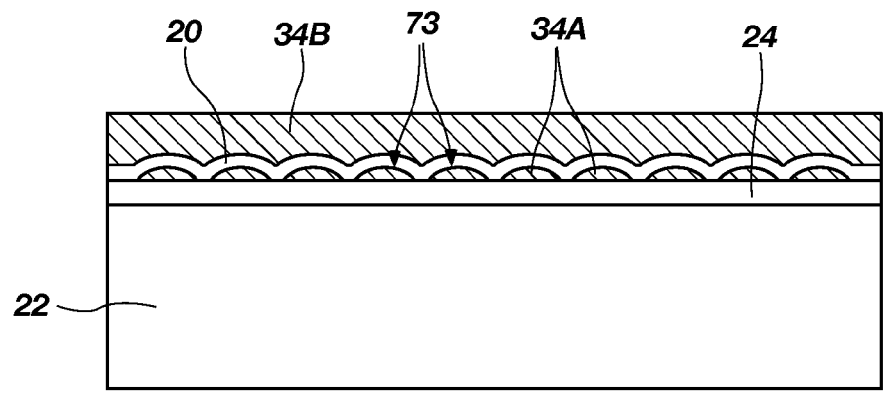

After providing the structure illustrated in FIG. 7C, another patterning process may be used to pattern the electrically conductive and magnetic material 34B, the colossal magnetocapacitive material 20, and the laterally isolated volumes 73 of the electrically conductive and magnetic material 34A in such a manner as to form the gate structure 68 and the semiconductor device 60, as shown in FIG. 4. Optionally, the electrically conductive and magnetic materials 34A, 34B may be magnetized, as previously discussed. Furthermore, additional processing may be performed on the semiconductor device 60 shown in FIG. 4 as necessary or desirable in order to provide a fully manufactured semiconductor device suitable for end use.

In some embodiments, the present invention includes semiconductor devices having one or more transistors that include a source, a drain, a channel region between the source and the drain, and a gate structure located proximate the channel region that comprises a colossal magnetocapacitive material capable of exhibiting colossal magnetocapacitance. The gate structure is configured to affect the flow of current through the channel region between the source and the drain. In some embodiments, the colossal magnetocapacitive material may be disposed between two structures, one or both of which may be electrically conductive, magnetic, or both electrically conductive and magnetic.

In additional embodiments, the present invention includes methods of fabricating semiconductor devices that include forming a colossal magnetocapacitive material proximate a channel region between a source and a drain of at least one transistor, and configuring the colossal magnetocapacitive material to exhibit colossal magnetocapacitance for generating an electrical field in the channel region.

In yet further embodiments, the present invention includes methods of affecting the flow of current through a transistor in which a colossal magnetocapacitive material is caused to exhibit colossal magnetocapacitance and generate an electrical field in a channel region of a semiconductor material between a source and a drain of the transistor.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the scope of the invention as defined by the claims that follow, and their legal equivalents. Furthermore, elements and features of one embodiment described herein may be implemented into, or combined with, any other embodiment described herein without departing from the scope of the invention.

What is claimed is:

1. A semiconductor device having at least one transistor comprising:
   a source;
   a drain;
   a channel region separating the source and the drain; and
   a gate for selectively controlling current flow through the channel region between the source and the drain, the gate comprising a capacitor comprising:
      a first electrically conductive, magnetic plate structure;
      a second electrically conductive, magnetic plate structure; and
      a colossal magnetocapacitive material disposed between the first electrically conductive, magnetic plate structure and the second electrically conductive, magnetic plate structure,
      wherein the first electrically conductive, magnetic plate structure comprises a continuous, single volume of electrically conductive, magnetic material and the second electrically conductive, magnetic plate structure comprises a discontinuous volume of electrically conductive, magnetic material.

2. The semiconductor device of claim 1, wherein the colossal magnetocapacitive material has a relative permittivity of about 6,000 or more.

3. The semiconductor device of claim 1, wherein the colossal magnetocapacitive material comprises a rare earth manganite.

4. The semiconductor device of claim 1, wherein the colossal magnetocapacitive material comprises at least one of $CaCu_3Ti_4O_{12}$, $CdCr_2S_4$, and $HgCr_2S_4$.

5. The semiconductor device of claim 1, wherein the first electrically conductive, magnetic plate structure comprises a metal alloy comprising cobalt, nickel, and iron.

6. A semiconductor device having at least one transistor comprising:
   a source;
   a drain;
   a channel region between the source and the drain; and
   a gate structure located close to the channel region and configured to affect a flow of current through the channel region between the source and the drain, the gate structure comprising a colossal magnetocapacitive material capable of exhibiting the colossal magnetocapacitance phenomenon, wherein the gate structure comprises a colossal magneto capacitor comprising:
      a first electrically conductive, magnetic plate structure adjacent the colossal magnetocapacitive material; and
      a second electrically conductive, magnetic plate structure adjacent the colossal magnetocapacitive material on a side thereof opposite the first electrically conductive, magnetic plate structure,
      wherein the first electrically conductive, magnetic plate structure comprises a continuous, single volume of electrically conductive, magnetic material and the second electrically conductive, magnetic plate structure comprises a discontinuous volume of electrically conductive, magnetic material.

7. The semiconductor device of claim 6, wherein the colossal magnetocapacitive material comprises a rare earth manganite.

8. The semiconductor device of claim 6, wherein the colossal magnetocapacitive material comprises at least one of $CaCu_3Ti_4O_{12}$, $CdCr_2S_4$, and $HgCr_2S_4$.

9. The semiconductor device of claim 6, wherein the colossal magnetocapacitive material is capable of exhibiting a relative permittivity of about 6,000 or more.

10. The semiconductor device of claim 9, wherein the colossal magnetocapacitive material is capable of exhibiting a relative permittivity of about 10,000 or more.

11. The semiconductor device of claim 10, wherein the colossal magnetocapacitive material is capable of exhibiting a relative permittivity of about 100,000 or more.

12. The semiconductor device of claim 6, wherein the colossal magneto capacitor of the gate structure is configured to provide an electrical field within the channel region.

13. The semiconductor device of claim 6, wherein the colossal magnetocapacitive material comprises a plurality of discontinuous volumes of colossal magnetocapacitive material, each discontinuous volume of the colossal magnetocapacitive material being located adjacent a corresponding discontinuous volume of the electrically conductive, magnetic material of the second electrically conductive, magnetic plate structure.

14. The semiconductor device of claim 6, wherein the first electrically conductive, magnetic plate structure comprises a metal alloy comprising cobalt, nickel, and iron.

15. The semiconductor device of claim 13, further comprising a dielectric material located between each adjacent discontinuous volume of colossal magnetocapacitive material.

16. The semiconductor device of claim 6, wherein the second electrically conductive, magnetic plate structure comprises a material differing from a material of the first electrically conductive, magnetic plate structure.

17. The semiconductor device of claim 6, further comprising a gate dielectric material disposed directly adjacent the channel region, and wherein the second electrically conductive, magnetic plate structure is disposed directly adjacent the gate dielectric material.

18. The semiconductor device of claim 6, wherein the discontinuous volume of electrically conductive, magnetic material of the second electrically conductive, magnetic plate structure comprises an array of discrete, laterally separated volumes of electrically conductive, magnetic material.

19. The semiconductor device of claim 18, wherein the discrete, laterally separated volumes of electrically conductive, magnetic material comprise volumes of a metal alloy comprising cobalt, nickel, and iron.

20. The semiconductor device of claim 6, wherein at least one of the first electrically conductive, magnetic plate structure and the second electrically conductive, magnetic plate structure is magnetized to provide a magnetic field within a region comprising the colossal magnetocapacitive material having at least one of a selected field intensity and a selected field orientation.

21. The semiconductor device of claim 6, wherein the at least one transistor forms at least a portion of a memory cell.

* * * * *